(12) United States Patent
Lam

(10) Patent No.: US 7,663,868 B1
(45) Date of Patent: Feb. 16, 2010

(54) DISPLAY DEVICES MOUNTING APPARATUS

(76) Inventor: Peter Ar-Fu Lam, 20104 Wayne Ave., Torrance, CA (US) 90503

( * ) Notice: Subject to any disclaimer, the term of this patent is extended or adjusted under 35 U.S.C. 154(b) by 356 days.

(21) Appl. No.: 11/515,050

(22) Filed: Sep. 1, 2006

Related U.S. Application Data

(60) Provisional application No. 60/715,712, filed on Sep. 10, 2005.

(51) Int. Cl.
H05K 5/00 (2006.01)
H05K 7/00 (2006.01)
B42F 13/00 (2006.01)

(52) U.S. Cl. .................... 361/679.06; 248/324

(58) Field of Classification Search .......... 361/681, 361/682; 248/309.1, 917, 919, 292.13, 274.1, 248/286.1; 211/99, 104
See application file for complete search history.

(56) References Cited

U.S. PATENT DOCUMENTS

| | | | | | |
|---|---|---|---|---|---|
| 3,774,247 | A | * | 11/1973 | Bradley | ............ 5/53.2 |
| 6,886,701 | B2 | * | 5/2005 | Hong et al. | ............ 211/99 |
| 6,964,399 | B1 | * | 11/2005 | O'Neill | ............ 248/292.13 |
| 7,090,182 | B2 | * | 8/2006 | O'Neill | ............ 248/289.11 |
| 7,175,146 | B2 | * | 2/2007 | Kim | ............ 248/279.1 |
| 7,445,187 | B2 | * | 11/2008 | Shin | ............ 248/324 |
| 2004/0012917 | A1 | * | 1/2004 | Jung et al. | ............ 361/681 |
| 2005/0167549 | A1 | * | 8/2005 | Ligertwood | ............ 248/122.1 |
| 2005/0236542 | A1 | * | 10/2005 | O'Neill | ............ 248/286.1 |
| 2005/0236543 | A1 | * | 10/2005 | O'Neil | ............ 248/286.1 |
| 2006/0219856 | A1 | * | 10/2006 | Oh | ............ 248/274.1 |
| 2006/0231711 | A1 | * | 10/2006 | Shin | ............ 248/291.1 |
| 2008/0029669 | A1 | * | 2/2008 | Olah et al. | ............ 248/276.1 |

* cited by examiner

Primary Examiner—Chandrika Prasad

(57) ABSTRACT

A mounting system for display devices provides for easy shipping, installation, and adjustment. First and second brackets are respectively mounted to the display device and the vertical supporting surface, such as a wall or otherwise. The two mounting brackets are then attached to one another in articulating fashion so that adjustment can be made for the mounted display device with respect to the stationary vertical surface. In an optional embodiment, a pan bracket assembly allows for additional angular adjustment of the mounted display device along different axes so as to provide greater adjustment for one or more axes, including an axis normal, or perpendicular, to the display device so that those viewing the display device are better able to see it.

25 Claims, 8 Drawing Sheets

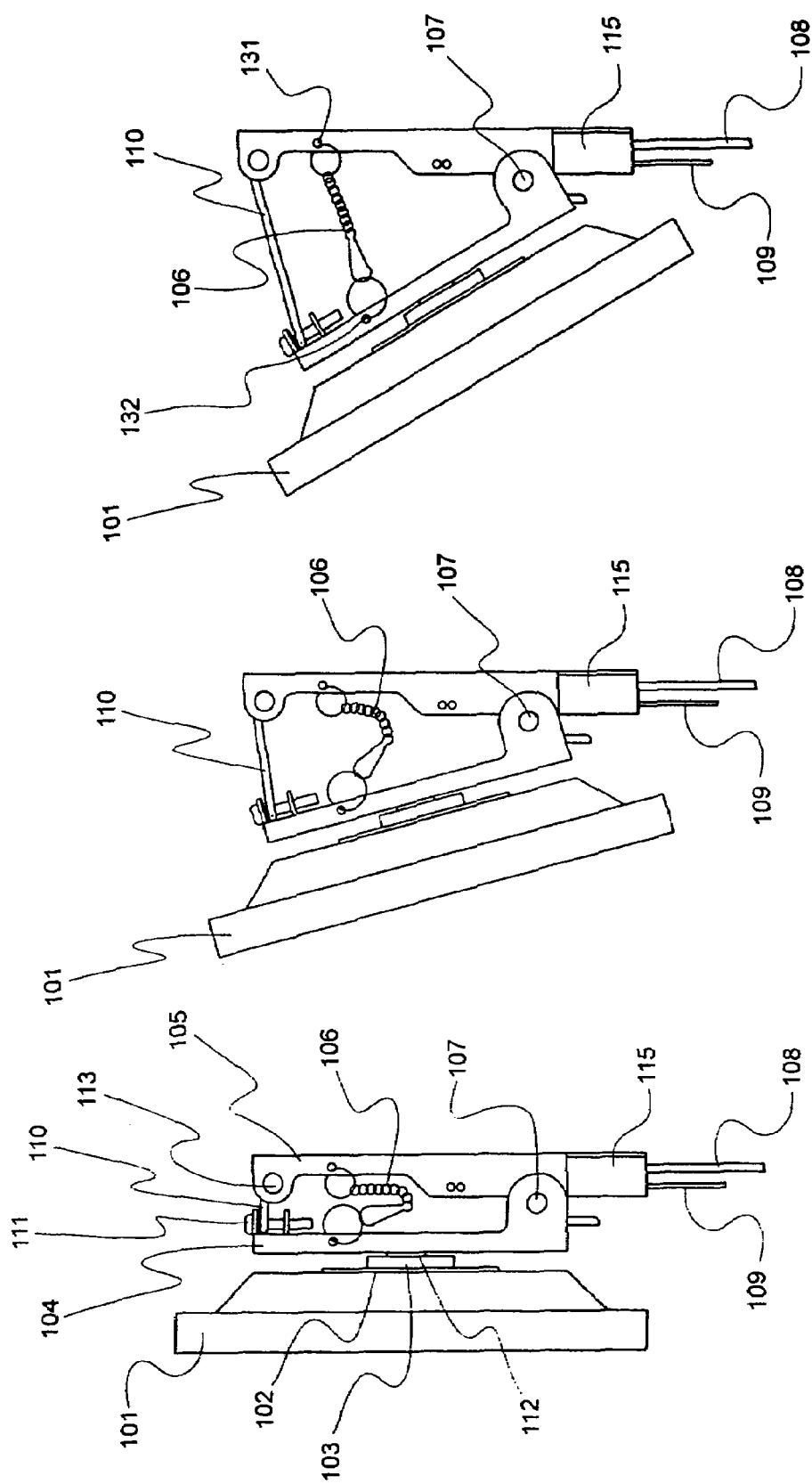

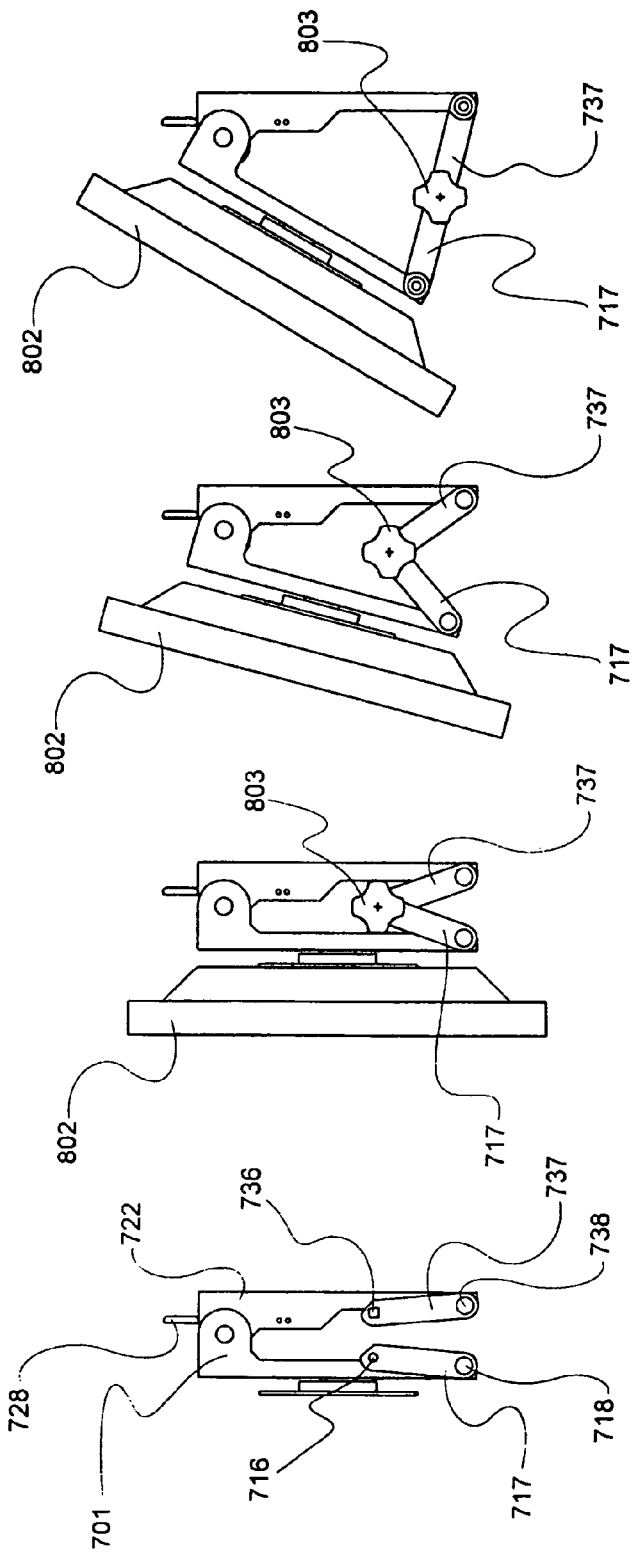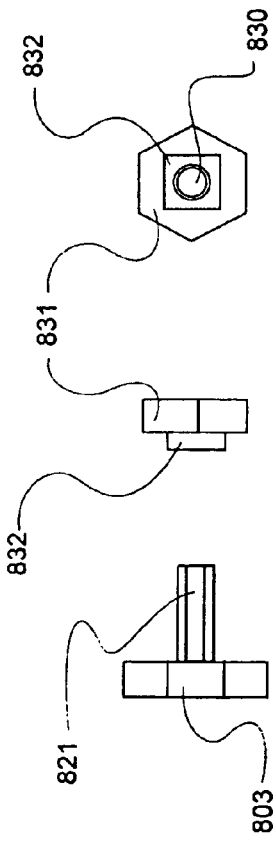

DISPLAY DEVICES MOUNTING APPARATUS

RELATED APPLICATION

This is a formal patent application of the provisional patent application No. 60/715,712 filed on Sep. 10, 2005.

COPYRIGHT AUTHORIZATION

A portion of the disclosure of this patent document contains material which is subject to copyright and/or mask work protection. The copyright and/or mask work owner has no objection to the facsimile reproduction by anyone of the patent document or the patent disclosure, as it appears in the Patent and Trademark Office patent file or records, but otherwise reserves all copyright and/or mask work rights whatsoever.

BACKGROUND OF THE INVENTION

1. Field of the Invention

This invention relates to mounting devices and more particularly to a mounting device for mounting generally-flat display devices against a wall or other vertical surface or support.

2. Description of the Related Art

Mounting devices are known in the art for speakers, display devices, and the like. However, such prior mounts may suffer drawbacks in that they do not allow for easy installation, mounting, and adjustment.

SUMMARY OF THE INVENTION

In view of the foregoing disadvantages inherent in the known types of mounts for display devices and the like now present in the prior art, the present invention provides a new mounting system for display devices wherein the same can be easily installed and adjusted.

The general purpose of the present invention, which will be described subsequently in greater detail, is to provide an easy to install and easy to adjust mounting system for display devices and the like which is not anticipated, or rendered obvious, suggested, or even implied by any of the prior art mounting devices, either alone or in any combination thereof.

First and second mounting brackets are separately mounted to, respectively, the display device and a vertical support. The two are then combined and adjusted by means of a variety of mechanical and/or operation in order to provide adjustment for the display device with respect to the vertical surface.

OBJECTS OF THE INVENTION

It is an object of the present invention to provide a mounting system for display devices and the like.

It is another object of the present invention to provide a mounting system for display devices and the like that is easy to install and easy to adjust.

It is yet another object of the present invention to provide a mounting system for display devices and the like that is readily transportable after manufacture.

Another object of the present invention is to minimize the storage size, shipping space and retail store shelf space occupied by the manufactured mounting system before it is installed by end users.

To provide an innovative mounting mechanism for mounting a display apparatus such as flat panel computer monitor or large screen flat panel TV against a vertical wall.

The innovative features of the disclosure enables the following benefits:

(a) Low cost and easy to assemble
(b) Occupy small packaging size
(c) Easy to install—an advantage specially required for heavy, large screen units
(d) Easy to adjust orientation, rotation, pan and tilt
(e) Base model to provide mounting and basic tilt function: add on optional accessory to add the "pan" function, no need to launch separate "pan and tilt" model in addition to the basic tilt only model.

These and other objects, advantages, and purposes of the present invention will be apparent from a review of the following specification and accompanying drawings.

BRIEF DESCRIPTION OF THE DRAWINGS

FIGS. 1A-1C show a left-side elevational view of the mounting system of the present invention at different angles of tilt.

FIGS. 7A-C and 8A-G illustrate an alternate embodiment enabling the display apparatus to be tilted upward as compared with a downward direction.

DESCRIPTION OF THE PREFERRED EMBODIMENT(S)

Figures 2A, 2B, 2C:
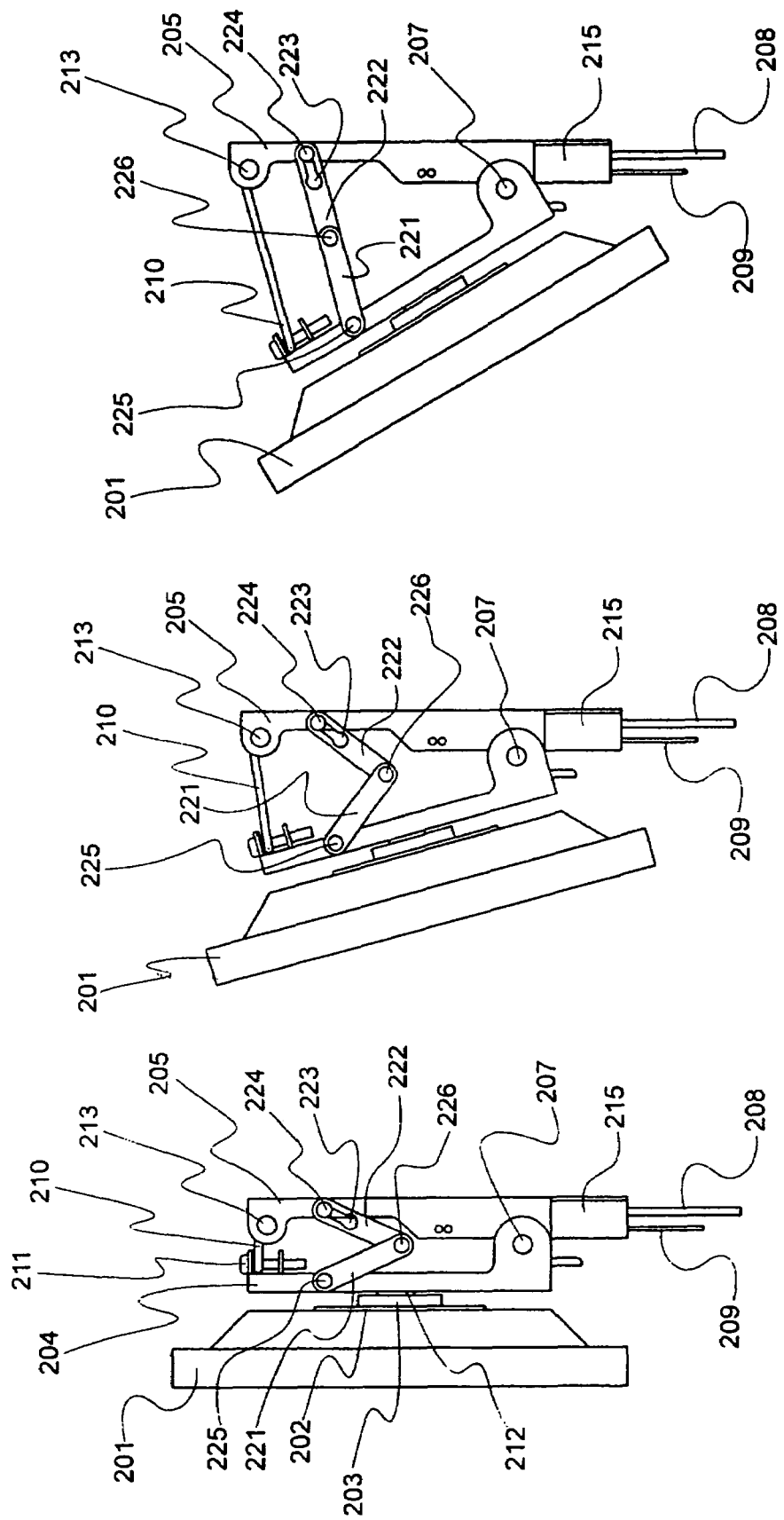
FIGS. 2A-2C show an alternative embodiment of the mounting system of the present invention at various angles of tilt.

The detailed description set forth below in connection with the appended drawings is intended as a description of presently-preferred embodiments of the invention and is not intended to represent the only forms in which the present invention may be constructed and/or utilized. The description sets forth the functions and the sequence of steps for constructing and operating the invention in connection with the illustrated embodiments. However, it is to be understood that the same or equivalent functions and sequences may be accomplished by different embodiments that are also intended to be encompassed within the spirit and scope of the invention.

The drawings accompanying this Description generally provide a complete disclosure of the present mounting system. In conjunction with the description set forth herein, the person of ordinary skill in the art will achieve the construction and understand the operation of the present mounting system.

Small Size Mounting Design (FIGS. 1A-C)

The structure of the small size mounting apparatus shown in FIGS. 1A-C includes:

a mounting bracket 105 for mounting onto a vertical supporting surface such as a wall;

102, 103, 104 and 112—mounting bracket assembly for mounting onto a display apparatus such as panel monitor or TV 101;

102 and 103 rotate against 104;

104 pivots against 105 against the pivot point 107 to provide a "tilt" motion;

110 extends to 108 is a flexible elongated element such as a cable to control the angle of tilt, pulling the cable 105 reduces the angle of tilt:

115 is a one direction locking mechanism locking the cable 108 in position when it is released. One direction locking mechanism is defined by a mechanism that allows a first component to lock with a second component from moving in a desired direction. After the two components are locked together, the first component will not be released from the second mechanism when it is moved in any direction. Releasing the two locked components will require activating a releasing mechanism.

109 is a string representing a control means to release the cable 108 and allow the cable 108 to be adjusted to provide a different tilting angle. It should be noted there are many different types of mechanism design commonly known in the art to lock or release the cable 108, or to control the extension adjustment of the cable 108, all these designs are to be encompassed in the scope of this invention.

106 is a safety member in the form of a chain; this is provided to prevent the display apparatus from falling, or from a rapid transition between the angular positions of FIG. 1A or FIG. 1B to FIG. 1C. The safety member reduces the impact to the display device when such conditions occur.

FIG. 1A shows the display panel at vertical position;

FIG. 1B shows the display panel having a different angular separation from the wall to define a desirable adjusted position;

FIG. 1C shows the display panel at the maximum allowable angle defined by the length of the safety chain 106.

Installation Procedure

Mount flat panel display apparatus 101 onto bracket 102;

Mount wall bracket 105 against a wall;

Insert the display apparatus mounting bracket assembly into slot of wall bracket 105;

Hook up the safety chain 106, the maximum tilting angle is defined by the length of the safety chain 106;

insert looped end of cable 110 into opening on the display apparatus mounting bracket 104, insert the pin 111 thru the upper hole, the loop of the string 110 and the lower hole to lock cable in position;

Alternate Small Size Mounting Design (FIGS. 2A-C)

Similar in design of FIGS. 1A-C except the safety chain is replaced by an adjustable length limiter formed by two plates 221, 222;

Plate 222 comes with a slot and a larger hole 223 for the plate to be engaged with the pin 224 during installation. The length of the plates 221 and 222 defines the limit of the tilt angle as shown in FIG. 2C.

Figures 3A, 3B:
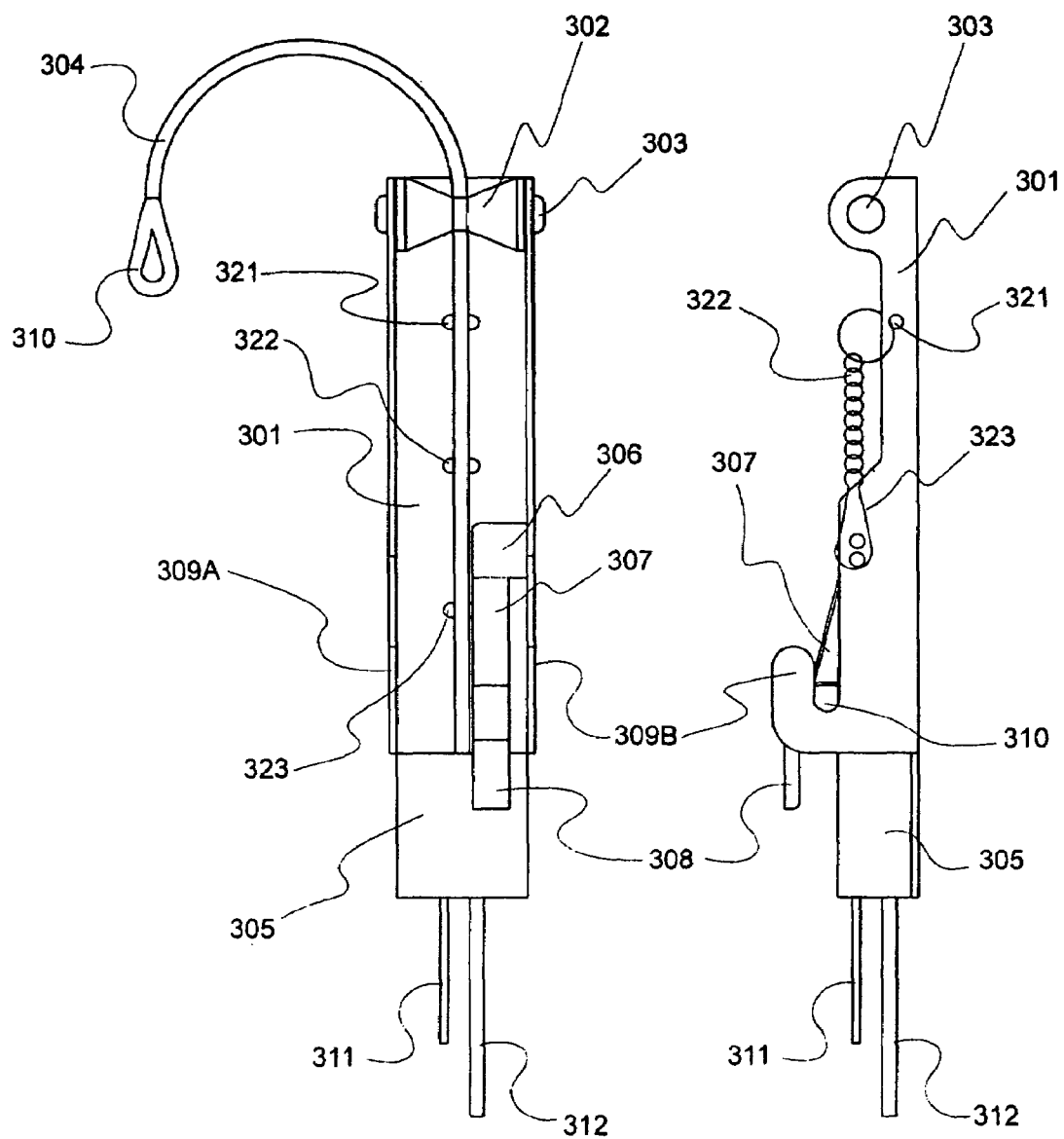
FIGS. 3A and 3B show detail of the mounting bracket for the wall-side of the mounting system set forth herein.

Wall Mounting Bracket Assembly (FIGS. 3A-B)

Structure:

FIGS. 3A and B shows in detail structure of the wall side mounting bracket.

Holes 321 to 323 are provided for the wall mounting bracket 301 to be mounted to a wall by screws or other mounting means;

Inside the box 305 is located a one direction locking mechanism and a releasing mechanism designed to lock the cable 304, 312 in position and to release the cable when the releasing mechanism is activated;

Pull and hold the string 311 to release the locking mechanism. The flexible elongated string 311 can be of different durable materials, such as strands of metal wires, metal chain or nylon wires. The terms string, chain, wire, and cable mentioned herein are equivalent components of similar nature as understood by a person having ordinary knowledge in the art, to service the design needs of disclosed embodiments. Accordingly, the terms string, chain, wire, cable or their functional equivalents are collectively defined as a string in the subject claims.

While holding the release string 311, pull or release the cable 312 to adjust tile angle. When the cable 312 is released, gravitational force due to the weight of the display apparatus will tend to increase the toiling, and/or tilt, angle. Pull the cable 312 will reduce the tilt angle.

Since the locking mechanism allows the cable 312 to be pulled, it is not necessary to pull and hold the release string 311 for reducing the tilt angle; simply pull the cable 312 to reduce the tilt angle. The second string control releasing design merely indicated a method to configure the locking and releasing mechanism. There are many different types of mechanism design commonly known in the art to control the extension of the cable 304 fed to the tilt angle adjustment mechanism, all these designs are to be encompassed in the scope of this invention.

The cable 304 with a loop 310 is for dressing to the display apparatus mounting bracket for controlling the tilting motion.

The pulley 302 enables the cable 304 to be smoothly extends to the display apparatus mounting bracket when the tilt angle is adjusted.

The quick lock latch (307), a part of the removable engaging mechanism is provided for one direction engagement with the pivot bar of the display apparatus mounting bracket to form the pivot point 107 in FIGS. 1A-C to lock the display apparatus in position. Installation is simple, simply slide the pivot bar of the display apparatus bracket into the slot behind 309A and 309B until the pivot bar rests at the position 310.

307 is spring loaded such that once locked, the flat panel display apparatus will be kept in position with the wall mounting bracket unless released by pressing the tab 308 to release the display bracket pivot bar from the position 310 of FIG. 3B.

After the two brackets are engaged, engage a safety member such as a safety chain 322, 323 to the display apparatus bracket to give a safety cushion when the one direction locking mechanism fails; or when the consumer releases the string 311 without holding the flat panel display apparatus, that may cause the display apparatus to experience a shock caused by the rapid angular transition.

Figures 4A, 4B:
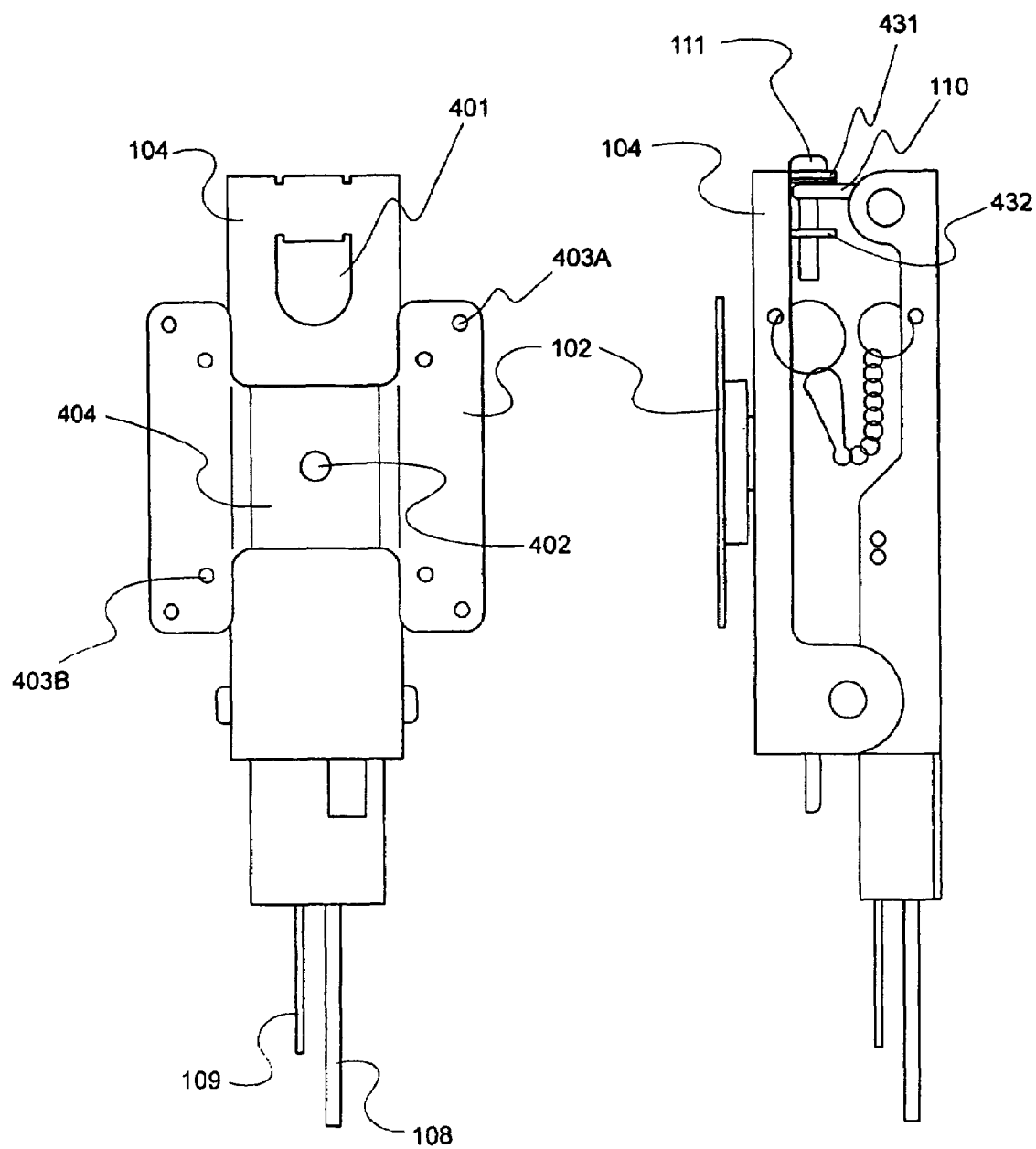
FIGS. 4A and 4B show a detail of the mounting system having a mounting bracket to be attached to the display device. The mounting system structure is set forth herein without the attached display device.

Display Side Mounting Bracket Assembly (FIGS. 4A-B)

Structure:

The swivel mounting plate 102 is factory assembled onto mounting bracket 104 by a rivet 402 with frictional pads in between. This design is used to provide a rotational function between the plate 102 and the bracket 104 for rotating the display apparatus. This is a useful feature to enable a LCD monitor to be viewed in portrait and landscape modes.

Mounting holes 403A, 403B are provided to lock the display side mounting bracket assembly with a display apparatus. The position of these holes are defined by the mounting hole locations of the flat panel display apparatus such as VESA, Part D, specifications or other industrial standards.

The bracket 104 may be cut and folded to provide mounting plates 431 and 432 for receiving the lock pin 111 to engage with the tilt mechanism adjustment cable 110.

Figures 5A, 5B, 5C:
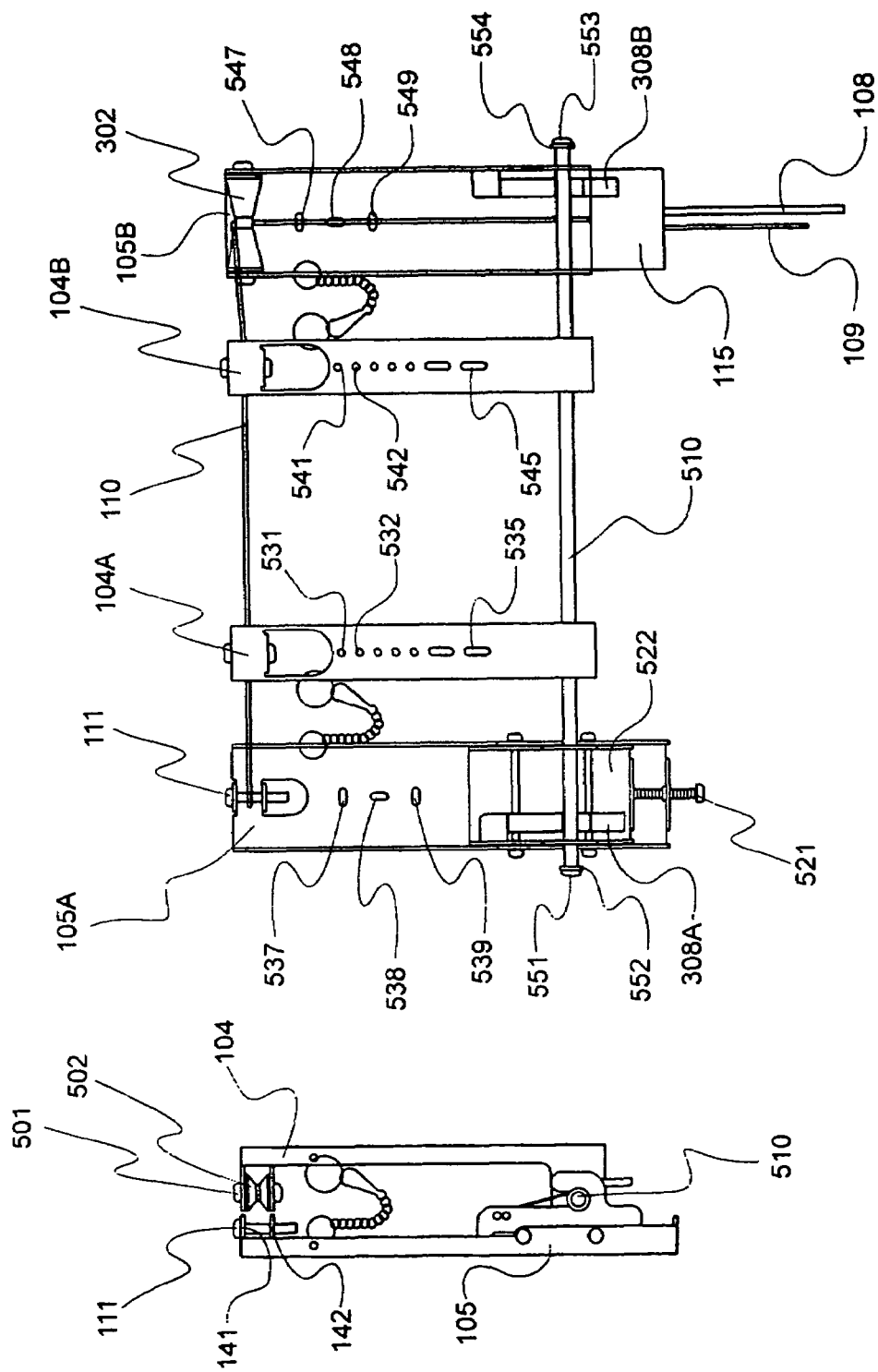
FIGS. 5A-5C show a large screen flat panel display mounting assembly with FIG. 5A showing a front and partial cutaway view thereof with FIG. 5B being a right side elevational view thereof and FIG. 5C being a left side elevational view thereof.

Large Screen Flat Panel Display Mounting Assembly (FIGS. 5A-C)

Structure:

A pair of wall mount brackets 105A and 105B are provided in the kit to mount onto a wall; the two-piece design of wall mount brackets is particularly suitable for the type of walls made of dry wall with variable wood studs having some distance of separation behind the dry wall. This flexible design saves metal material and reduces packaging size as compared with traditional one piece wall mounting bracket design.

A pair of display apparatus mounting brackets 104A and 104B are provided to mount with a large size display apparatus;

A pivot bar 510 is provided to link the two display apparatus side mounting brackets, and to engage the display apparatus assembly with the wall mounted brackets;

The wall mount bracket 105B is of similar structure to that of FIGS. 1A-C except a longer cable 110 is provided;

The wall mount bracket 105A comprises an adjustment mechanism for fine tune adjustment of the horizontal level of the display apparatus. This adjustment is achieved by adjusting the screw 521 which controls the vertical position of the sliding bracket 522. The sliding bracket 522 slides along the wall mount bracket 105A, and provides a one direction, or one-way, locking mechanism to engage the pivot bar 510. This one direction locking mechanism is similar in structure to that of the wall mount bracket 105B of FIG. 5A and the corresponding locking design of FIGS. 3A-B.

Multiple mounting holes 631-535 and 541-545 are provided for the display apparatus brackets 104A and 104B to be mounted with screens of different sizes.

Hole patterns 531, 532, 535, 541, 542, 545 (FIG. 5A) comply with VESA specifications or any other design specification in the industry.

One or two safety members are provided for each pair of bracket assemblies; it should be noted that the safety chain can be replaced by any other protection design known in the art, such as multiple strand cable, coil spring, string, combination thereof or any other type of designs to provide the desirable protection effect.

The pivot bar 510 comes with stopper end caps formed by the rings 552, 554 and the screws 551 and 553.

The pivot bar may be factory assembled with the display panel mounting brackets 104A, 104B, or field assembled to reduce packaging size. The brackets 104A, 104B and the pivot bar form an assembly to be mounted onto the rear side of a display apparatus.

The mounting brackets 104A and 104B are free to slide along the pivot bar 510. A very significant advantage of this design is that the horizontal positions among the mounting brackets 105A, 104A, 104B and 105B can all be variable, accordingly this design enables the mounting device to work with display apparatus having different horizontal mounting holes separation, and for any display apparatus to be mounted onto different walls having variable stud separation.

Although the embodiment illustrated a pivot bar to connect the mounting brackets 104A and 104B, and to provide a pivot point enabling tilt angle adjustment when the display apparatus mounting assembly is engaged with the wall mount brackets, alternate designs commonly known in the art is always possible, such as replacing the pivot bar with a strong horizontally elongated metal bracket, or providing another rigid connection member between the mounting brackets 104A and 104B to strengthen the support of the display apparatus or to provide additional articulation functions. All these alternate designs are to be encompassed within the scope of this invention as claimed.

Installation Procedure

Fasten the wall mounting bracket 105A and 105B onto a wall; the brackets should be mount at the same horizontal level;

If the wall is made of dry wall with wood studs behind, the wall mount brackets should be located and the wall mount brackets should be mounted against or into the wood studs;

Mounts the brackets 104A and 104B with the display apparatus;

Assemble the pivot pin into the display apparatus mounting brackets 104A and 104B if it is not factory assembled;

Lift the flat panel display apparatus to the wall mounted brackets and engage the pivot pin 510 to the one direction catch of the wall mount brackets 105A and 105B.

Engage the safety member such as the safety chains provided;

Pass the cable 110 through the pulleys 502 of the display apparatus mounting brackets 104A, 104B and lock the end of the cable 110 with the wall mount bracket 105A by the lock pin 111;

Pull the cable 108 until the flat display panel rests against the wall;

Align the horizontal position of the display panel by adjusting the screw 521;

Hold the upper side of the display panel and pull the release string 109 to gradually increase the tilt angle to a desirable position and then release the string 109;

If the tilt angle is to be decreased, simply pull the cable 108;

The mechanism is preferably to be configured with a removable engagement mechanism. Removable engagement mechanism is defined by a mechanism that allows two locked parts to be released from each other without a tool. If the display panel is to be removed from the wall, remove the locking pin 111, disengage the safety member, and activate the removable engagement mechanism of the mounting bracket 105A by pressing the release tab 308A to remove the pivot bar from the wall mount bracket 105A. Similarly for the removable engagement mechanism of the mounting bracket 105B, press the release tab 308B to remove the pivot bar from the wall mount bracket 105B.

Figure 6A:
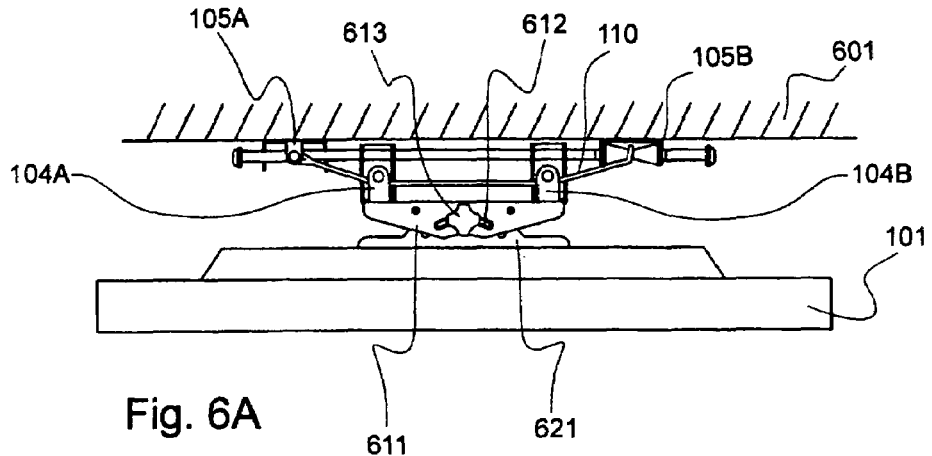
FIGS. 6A-6C show the pan bracket assembly from top views thereof for FIGS. 6A and 6B and a left side elevational view thereof for FIG. 6C.
Figure 6B:
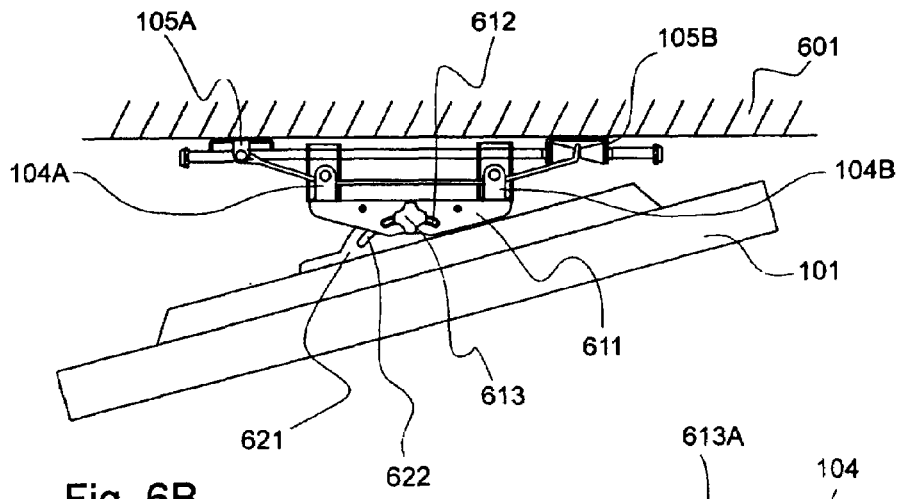
Figure 6D:
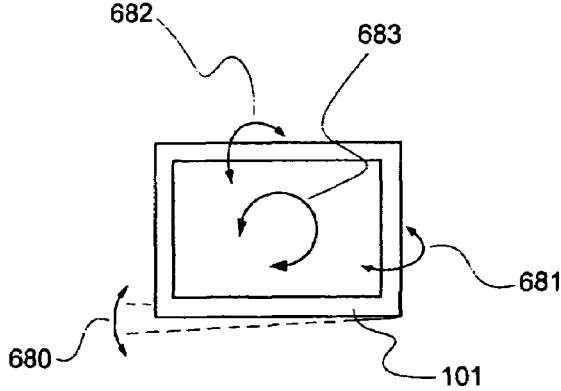
FIG. 6D is a schematic showing the available degrees of freedom—rotate, tilt, pan, and horizontal alignment available via the mounting system set forth herein with the optional pan bracket assembly.

Defining the Adjustable Features—FIG. 6D

"Rotate" function as shown in motion direction 683 to provide portrait and landscape views as shown in FIGS. 1A-C; FIGS. 2A-C and FIG. 4A;

"Tilt" function as shown in motion direction 682 to adjust the viewing angle of the flat panel display to face different direction horizontally.

"Pan" function as shown in motion direction 681 to enable the flat panel display to face different direction horizontally;

"Horizontal alignment" as shown in motion direction 680 to final tune the horizontal level of the display apparatus.

Figure 6C:
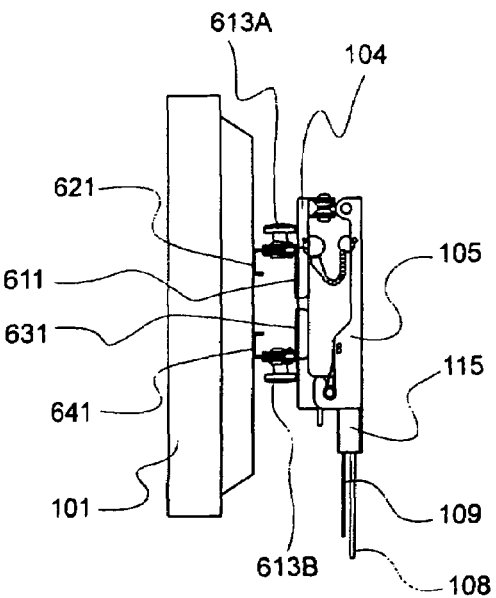

Pan Bracket Assembly (FIGS. 6A-C)

Structure:

A pan adjustment mechanism is provided as an optional add-on to the mounting kit illustrated in FIGS. 5A-C; this adjustment mechanism is specifically designed as an optional add on assembly so as to reduce the number of products to be included in the mounting frame product line. The benefits of this configuration are to minimize store shelf space occupied, and also to facilitate factory inventory control, as only some of the customers are willing to pay for the extra function of panning the display apparatus.

The pan adjustment kit comprises two pairs of plates 611, 621 and 631, 641 configured to provide horizontal motion relative to each other;

Plate 611 comprises a curved guide 612 which travels via a corresponding curved slot 622 of the plate 621; although the plates 611, 631 or 621, 641 can be integrated into one single piece, the two pairs form not only enables the design to work with variable vertical mounting hole separation, this design also reduces packaging size;

The knobs 613A and 613B are provided to tighten the relative position of the two plates once the adjustment is completed.

Installation Procedure

Before the panel brackets 104A and 104B are engaged with the wall mounted brackets 105A, 105B, instead of mount he panel brackets 104A and 104B to the display panel, mount the brackets 104A and 104B with the plates 611, 631 with the screws provided;

Mount the plates 621, 641 with the display apparatus 101 and install the knobs 613A and 613B;

Engage the assembly with the wall mounting brackets as previously described;

Adjust the assembly as previously described.

Upward Tilting Mounting Mechanism Embodiment (FIGS. 7A-C, FIGS. 8A-G)

Figures 7A, 7B, 7C:
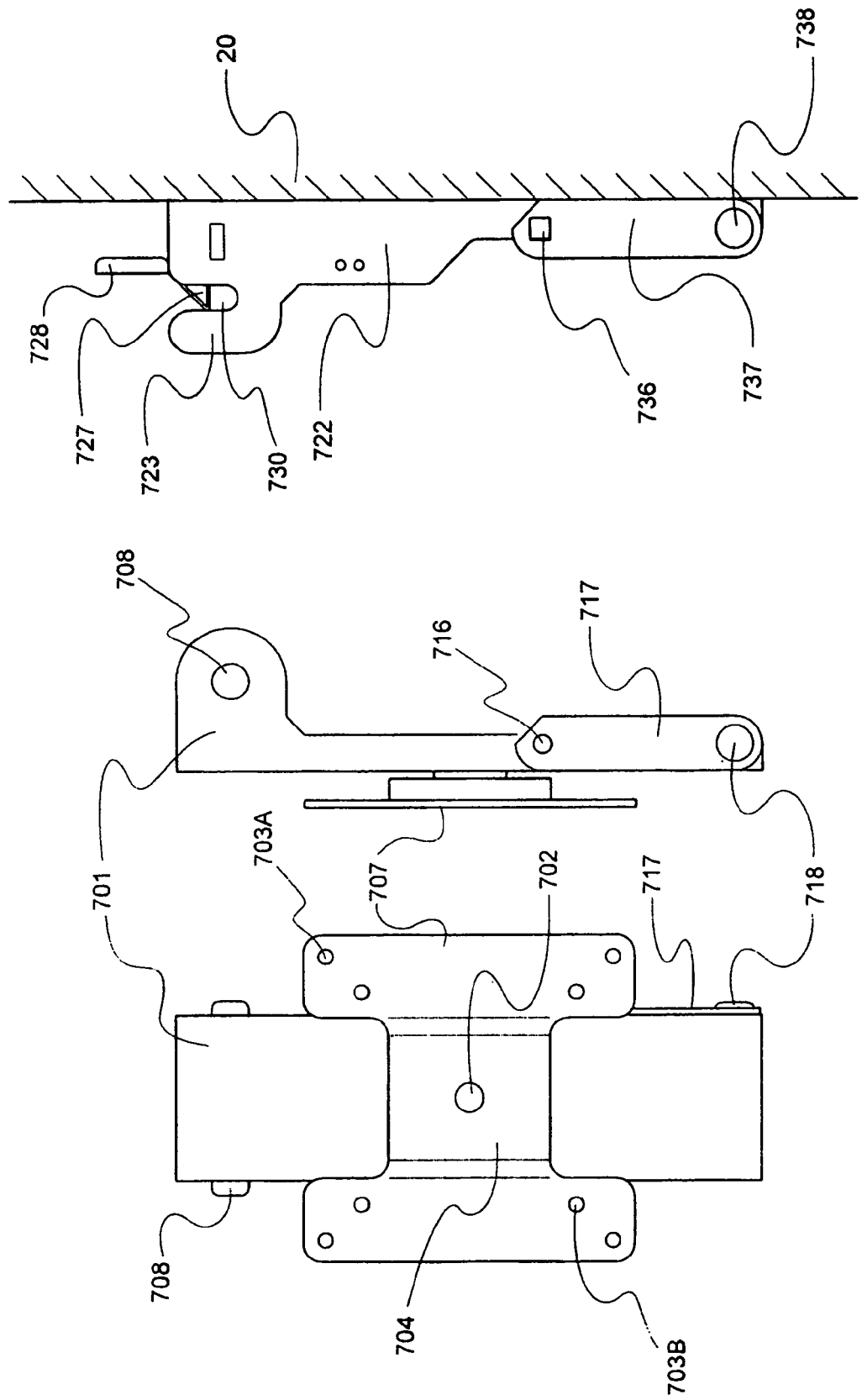

Structure:

The previously described adjustment mechanism enables the display apparatus to tilt downward by the gravitational force of the display apparatus. FIGS. 7A-C illustrates an alternate embodiment enabling the display apparatus to be tilted upward.

The swivel mounting plate 707 is factory assembled onto mounting bracket 701 by a rivet 702 with frictional pads in between. This design is to provide a rotational function between the plate 707 and the bracket 701 for rotating the display apparatus. This is a useful feature to enable a display apparatus such as a LCD monitor to be viewed in portrait and landscape modes.

Mounting holes 703A, 703B are provided to lock the display side mounting bracket assembly with a display apparatus. The position of these holes are defined by VESA Part D specifications or any other specified design standards.

The bracket 701 was folded to hold a mounting pin 708, which will be locked with the catch 723 of the wall mount bracket 722 when the display apparatus is to be mounted onto the wall mount bracket 722.

The spring loaded latch 727 enables a downward engagement of the pin 708 into the position 730.

A release handle 728 is provided to retreat the latch for releasing the pin 708, so as to release the display device from the wall mount bracket 722 when required. Pushing the release tap 728 retreats the latch 727 and release the pin 708 engaged under the latch 727 when the display device is mounted.

An adjustment plate 717 is provided at the lower end of the display device mounting bracket 701. This adjustment plate connects with the corresponding adjustment plate 737 extended from the wall side mounting bracket 722 after the display device is locked with the wall mount bracket 722. Instead of attaching the first plate 717 to the display apparatus side mounting bracket and the second plate 737 to the wall side mounting bracket, the two plates and one of the mounting brackets can be mounted together in the factory as shown in FIG. 2A and then attached to the other mounting bracket in the field.

The assembly of FIGS. 8A to 8D allows the display apparatus to be tilted downward. This assembly can be easily modified for installation in an up side down position so as for the display apparatus to be tilted upward. In both situations, the plates 717 and 737 serves as a angle limit device to serve some functions of the safety member, so as to prevent the display apparatus from falling or damaged from a rapid transition between the angular positions of FIG. 8B, or FIG. 8C to the angular position of FIG. 8D

Installation Procedure:

Making use the mounting holes 703A-B and accessory screws provided (not shown) to mount the plate 707 behind a display apparatus.

Install the wall mount bracket 722 onto a panel, or a wall 20 as shown on FIG. 7C.

Position the mounting pin 708 on top of the latch 727 and gently move the pin downward for the pin to be received by the catch 723 of the bracket 722. During the downward movement, the angled edge of the latch 727 moves backward until the pin 708 completely rests into the locking position below the latch 727. The latch 727 is spring loaded to lock the pin 708 in position, as shown in FIG. 8A.

A tightening knob 803 is provided to lock the angular displacement between the plates 717 and 737 for controlling the tilting angle of the display apparatus 802 against the wall 20 of FIG. 7C.

The tightening knob 803 comes with a screw 821 which goes through the holes 716 and 736 before it is engaged with the nut 831.

The nut 831 comes with a square structure 832. This square structure fits with the square hole 736 of the plate 737 to prevent the nut 831 from rotating when the tightening knob 803 is rotated.

To adjust the tilt angle, loosen the knob 803 and tilt the display apparatus to a desirable angle and then tighten the knob 803 again.

To release the display device from the wall mount bracket 722, disassemble the knob/screw 803/821 from the nut 831, push the tab 728 towards the wall to release the latch 727, and move the display apparatus upward to disengage the pin 728 from the catch 723.

The mounting system set forth herein provides easy to attach, easy to install, easy to use, and easy to adjust elements so that a display device can be installed in a stable fashion upon a vertical supporting surface such as a wall, and yet still be afforded some range of degree of freedom so that the viewing audience gets a better or best view of the display device. The elements set forth herein operate in tandem and conjunction with one another in order to provide the display device mounting system as set forth herein.

While the present invention has been described with regards to particular embodiments, it is recognized that additional variations of the present invention may be devised without departing from the inventive concept.

What is claimed is:

1. A method to mount a display apparatus against a vertical supporting surface comprising the steps of:
    (1) mounting a first mounting bracket onto the vertical supporting surface;
    (2) mounting a second mounting bracket with the display apparatus;
    (3) engaging said second mounting bracket with said first mounting bracket to provide angular adjustment for a first angular separation between said display apparatus and said vertical supporting surface; and (4) providing a first string coupled to said first and second mounting brackets; and installing said first string for adjusting the angular separation between said display apparatus and said vertical supporting surface.

2. The method of claim 1 further comprising the steps of:

(5) mounting a third mounting bracket onto said vertical supporting surface; and (6) mounting a fourth mounting bracket with said display apparatus.

3. The method of claim 2 wherein said step (3) is a step to engage the assembly of said second and fourth mounting bracket with said first and third mounting bracket to provide an angular adjustment for the angular separation between said display apparatus and said vertical supporting surface.

4. The method of claim 2 further comprising a step to mount a rigid connection member between said second and fourth mounting brackets for said second and fourth mounting brackets to be engaged with said first and third mounting brackets.

5. The method of claim 1 wherein said step (2) comprising a further step to combine said second mounting bracket with an adjustment mechanism; and another step to mount said adjustment mechanism with said display apparatus; wherein said adjustment mechanism is structured to provide angular adjustment for a second angular separation between said display apparatus and said vertical supporting surface.

6. The method of claim 1 further comprising a step to provide a safety member to limit the angular separation between said display apparatus and said vertical supporting surface or to reduce the impact of said display apparatus in case in case said display apparatus failed to stay with the normal operation position from said vertical supporting surface.

7. The method of claim 1 further comprising a step to provide a locking and releasing means provided for locking or releasing said first string for controlling the angular separation between said display apparatus and said vertical supporting surface.

8. The method of claim 7 wherein said releasing means is represented by a second string.

9. The method of claim 1 further comprising a one direction locking mechanism for controlling the extension of said first string in between said first and second mounting brackets so as to adjust the angular separation between said display apparatus and said vertical supporting surface.

10. The method of claim 2 wherein said vertical supporting surface is a wall having at least two studs located behind said wall; said method further comprising a step to locate the position of said studs and to mount said first and third mounting brackets onto said studs from the other side of the wall.

11. A display mounting device comprising:

first mounting bracket for mounting with a vertical supporting surface;

second mounting bracket for mounting with a display apparatus and to define an angular separation between said first mounting bracket;

engaging means provided for said second mounting bracket to engage with said first mounting bracket and for providing angular adjustment between said display apparatus and said verticals supporting surface; and a string configured for adjusting the angular separation between said first and second mounting brackets by pulling or releasing said string from said display mounting device.

12. The display mounting device of claim 11 further comprising a safety member to limit the angular separation between said display apparatus and said vertical supporting surface or to reduce the impact of said display apparatus in case said display apparatus failed to stay with the normal operation position from said vertical supporting surface.

13. The display mounting device of claim 11 further comprising a locking means provided for locking said first string and for controlling the angular separation between said display apparatus and said vertical supporting surface so as to define a first angular position.

14. The display mounting device of claim 13 further comprising control means for allowing said first string to release said display apparatus from said first angular position so as for a user to adjust said display apparatus to a second angular position from said vertical supporting surface.

15. The display mounting device of claim 14 wherein said control means is represented by a second string.

16. The display mounting device of claim 11 further comprising a third mounting bracket for mounting with said vertical supporting surface and a fourth mounting bracket for mounting with said display apparatus.

17. The display mounting device of claim 15 further comprising a rigid connection member provided for connecting said second and fourth mounting brackets and for said second and fourth mounting brackets to be engaged with said first and third mounting brackets.

18. The display mounting device of claim 11 further comprising an optional add on adjustment mechanism structured for mounting in between said second mounting bracket and said display apparatus; wherein said adjustment mechanism is further structured to provide angular adjustment for a second angular separation between said display apparatus and said vertical supporting surface.

19. The display mounting device of claim 18 wherein said adjustment for a second angular separation between said display apparatus and said vertical supporting surface is defined by a pan motion.

20. The display mounting device of claim 11 wherein said adjustment for a first angular separation between said display apparatus and said vertical supporting surface is defined by a tilt motion.

21. The display mounting device of claim 11 wherein one of said mounting bracket comprises a one direction locking mechanism configure to receive the other mounting bracket.

22. The display mounting device of claim 11 wherein said engaging means is a removable engagement mechanism.

23. A display mounting device comprising:

first mounting bracket for mounting with a vertical supporting surface;

second mounting bracket for mounting with a display apparatus;

one direction locking means having a spring loaded catch for said first mounting bracket to be engaged with said second mounting bracket and for providing angular adjustment for a first angular separation between said display apparatus and said vertical supporting surface.

24. The display mounting device of claim 23 further comprising a string configured for adjusting the angular separation between said first and second mounting brackets.

25. The display apparatus of claim 23 further comprising releasing means for unlocking said first mounting bracket from said second mounting bracket.

* * * * *